(12) United States Patent
Higuchi et al.

(10) Patent No.: US 10,985,173 B2
(45) Date of Patent: Apr. 20, 2021

(54) NON-VOLATILE STORAGE DEVICE AND METHOD OF MANUFACTURING THE SAME

(71) Applicant: Toshiba Memory Corporation, Tokyo (JP)

(72) Inventors: Masaaki Higuchi, Yokkaichi Mie (JP); Masaru Kito, Kuwana Mie (JP); Masao Shingu, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 93 days.

(21) Appl. No.: 15/897,623

(22) Filed: Feb. 15, 2018

(65) Prior Publication Data

US 2018/0175057 A1 Jun. 21, 2018

Related U.S. Application Data

(60) Division of application No. 15/398,230, filed on Jan. 4, 2017, now Pat. No. 9,929,176, which is a (Continued)

(30) Foreign Application Priority Data

Sep. 10, 2013 (JP) ................................. 2013-187523

(51) Int. Cl.
*H01L 27/11582* (2017.01)
*H01L 27/1157* (2017.01)
(Continued)

(52) U.S. Cl.
CPC .... *H01L 27/11582* (2013.01); *H01L 27/1157* (2013.01); *H01L 29/66833* (2013.01); *H01L 29/7926* (2013.01)

(58) Field of Classification Search
CPC .................. H01L 27/1157; H01L 27/11582
See application file for complete search history.

(56) References Cited

U.S. PATENT DOCUMENTS 7,808,028 B2 * 10/2010 Cheng ................... H01L 21/84
257/301
9,583,504 B2 2/2017 Higuchi et al.
(Continued)

FOREIGN PATENT DOCUMENTS

JP 2009-164485 7/2009
JP 2010-114204 5/2010
(Continued)

OTHER PUBLICATIONS

Japanese Office Action dated Jan. 27, 2016, filed in Japanese counterpart Patent Application No. 2013-187523, 24 pages (with English translation).
(Continued)

*Primary Examiner* — Jamie C Niesz
(74) *Attorney, Agent, or Firm* — Kim & Stewart LLP

(57) ABSTRACT

According to an embodiment, a non-volatile storage device includes a first layer, a second layer formed on the first layer, a stacked body including a plurality of conductive films stacked on the second layer, and a semiconductor pillar which penetrates the stacked body and the second layer and reaches the first layer. The semiconductor pillar includes a semiconductor film formed along an extending direction of the semiconductor pillar, and a memory film which covers a periphery of the semiconductor film. The memory film includes a first portion formed between the stacked body and the semiconductor film and a second portion formed between the second layer and the semiconductor film. An outer periphery of the second portion in a plane perpendicular to the extending direction is wider than an outer periphery of the first portion on a second layer side of the stacked body.

20 Claims, 11 Drawing Sheets

Related U.S. Application Data continuation of application No. 14/194,757, filed on Mar. 2, 2014, now Pat. No. 9,583,504.

(51) Int. Cl.
  *H01L 29/66* (2006.01)
  *H01L 29/792* (2006.01)

(56) References Cited

U.S. PATENT DOCUMENTS

| | | | |
|---|---|---|---|
| 2009/0146206 A1* | 6/2009 | Fukuzumi | H01L 27/11556 257/324 |
| 2010/0044776 A1 | 2/2010 | Ishiduki et al. | |
| 2011/0018050 A1 | 1/2011 | Fujiwara et al. | |
| 2011/0018052 A1 | 1/2011 | Fujiwara et al. | |
| 2011/0316064 A1 | 12/2011 | Kim et al. | |
| 2012/0213009 A1* | 8/2012 | Aritome | H01L 27/11556 365/185.29 |
| 2012/0235221 A1* | 9/2012 | Ishiduki | H01L 21/425 257/324 |
| 2012/0241846 A1 | 9/2012 | Kawasaki et al. | |
| 2012/0306007 A1 | 12/2012 | Yanagisawa | |
| 2013/0228853 A1* | 9/2013 | Higuchi | H01L 27/11582 257/329 |
| 2014/0001544 A1 | 1/2014 | Sato et al. | |
| 2014/0217493 A1 | 8/2014 | Fukuzumi et al. | |

FOREIGN PATENT DOCUMENTS

| | | |
|---|---|---|
| JP | 2011-029234 | 2/2011 |
| JP | 2012-195424 | 10/2012 |

OTHER PUBLICATIONS

Japanese Office Action dated Aug. 19, 2016, filed in Japanese counterpart Patent Application No. 2013-187523, 15 pages (with English translation).

* cited by examiner

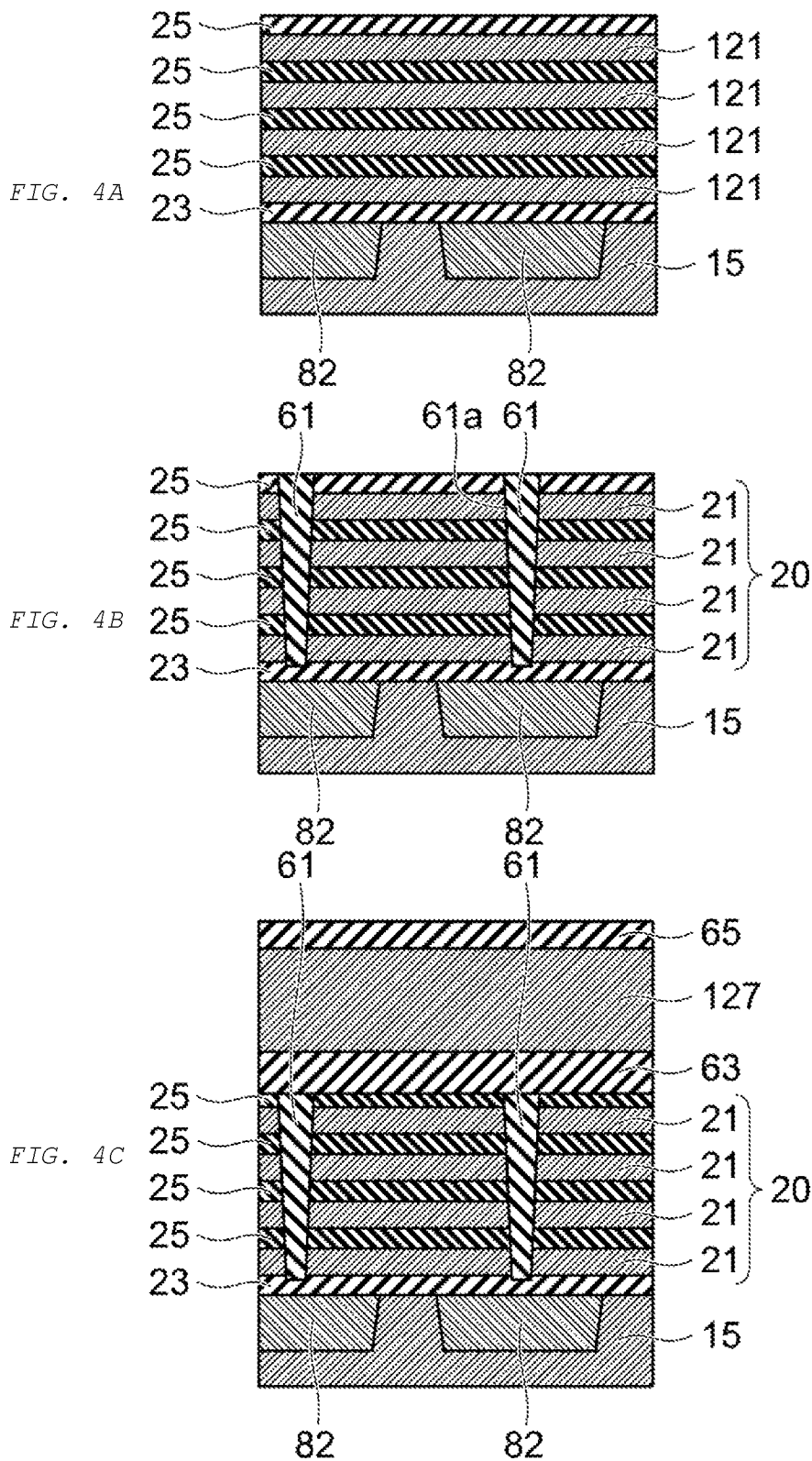

NON-VOLATILE STORAGE DEVICE AND METHOD OF MANUFACTURING THE SAME

CROSS-REFERENCE TO RELATED APPLICATIONS

This application is a division of U.S. patent application Ser. No. 15/398,230, filed on Jan. 4, 2017, which is a continuation of U.S. patent application Ser. No. 14/194,757, filed on Mar. 2, 2014, now U.S. Pat. No. 9,583,504, issued on Feb. 28, 2017, which is based upon and claims the benefit of priority from Japanese Patent Application No. 2013-187523, filed on Sep. 10, 2013, the entire contents of each of which are incorporated herein by reference.

FIELD

Embodiments described herein relate to a non-volatile storage device and a method of manufacturing a non-volatile storage device.

BACKGROUND

The development of a non-volatile storage device provided with a memory cell array where memory cells are arranged three dimensionally is progressing. For example, a structure which includes a silicon substrate, a plurality of word lines which are stacked on the silicon substrate, and memory cell strings which penetrate these word lines is known. In the manufacturing of a non-volatile storage device having such structure, a memory film is formed on an inner wall of a memory hole which penetrates the plurality of word lines, and a semiconductor film is formed on the memory film in the memory hole. With such a configuration, a plurality of memory cell strings which extend in the direction perpendicular to the silicon substrate can be formed. However, as miniaturization of the memory cells progresses, the size of memory hole becomes finer which creates a possibility that the memory hole may be closed during the step of forming the memory film. When the memory hole is closed, the semiconductor film cannot be formed within the memory hole and hence, the memory cell string will not function.

DESCRIPTION OF THE DRAWINGS

FIG. 4A to FIG. 4C are schematic cross-sectional views showing steps of manufacturing the non-volatile storage device which follow the steps shown in FIG. 3A to FIG. 3D.

DETAILED DESCRIPTION

Figure 1:
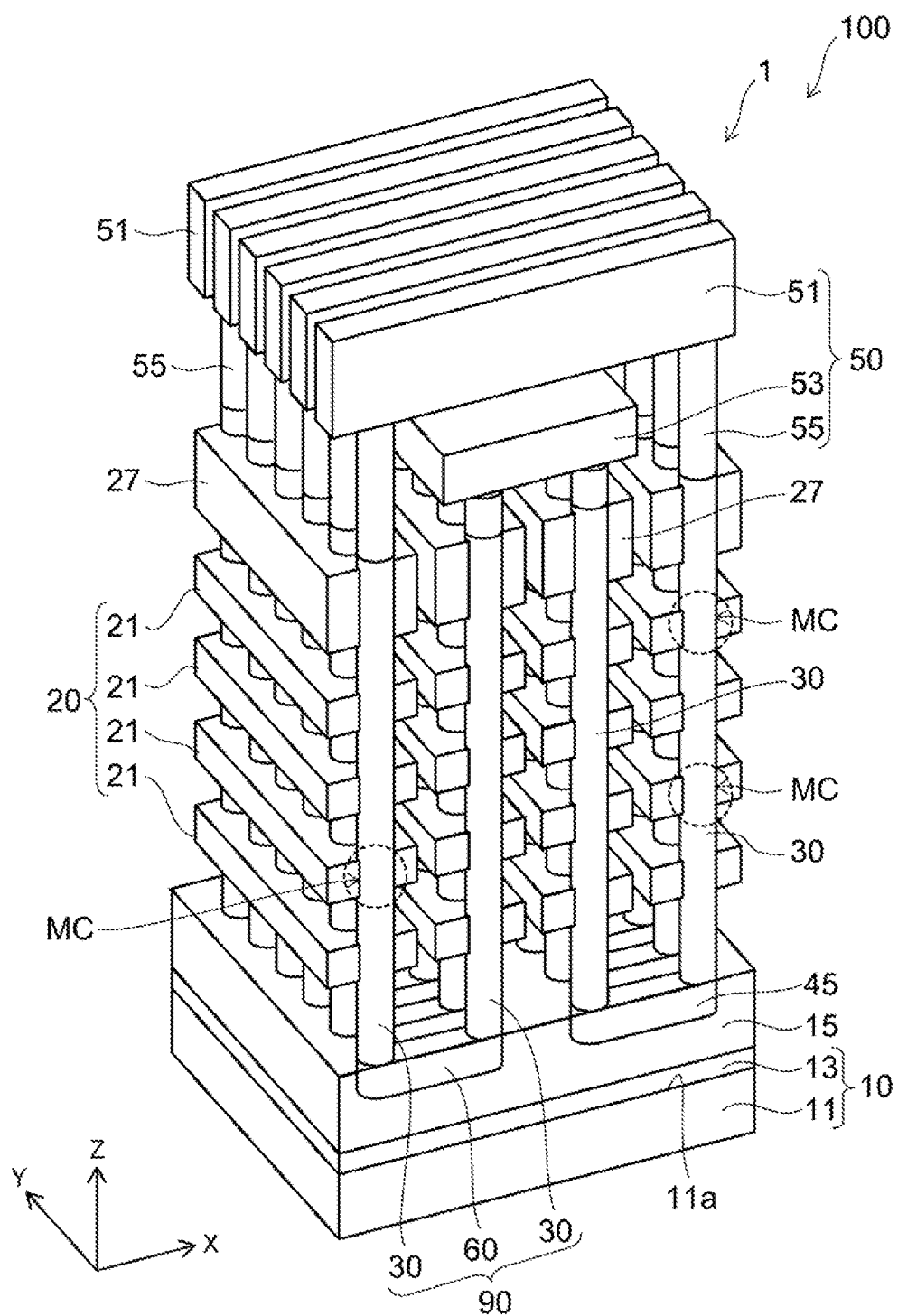
FIG. 1 is a perspective view schematically showing a non-volatile storage device according to a first embodiment.

According to one embodiment, there is provided a non-volatile storage device and a method of manufacturing the non-volatile storage device which can prevent the closing of memory holes before a conductive material, such as polysilicon, is deposited therein, thus enhancing a yield of manufacturing non-volatile storage devices.

In general, according to one embodiment, a non-volatile storage device includes: a first layer; a second layer formed on the first layer; a stacked body including a plurality of conductive films stacked on the second layer; and a semiconductor pillar which penetrates the stacked body and the second layer and reaches the first layer. The semiconductor pillar includes a semiconductor film formed along an extending direction of the semiconductor pillar, and a memory film which covers a periphery of the semiconductor film. The memory film includes a first portion formed between the stacked body and the semiconductor film and a second portion formed between the second layer and the semiconductor film. An outer periphery of the second portion in a plane perpendicular to the extending direction is wider than an outer periphery of the first portion on a second layer side of the stacked body.

Hereinafter, an embodiment is explained with reference to the drawings. In the drawings, identical elements are given the same symbols and a detailed explanation of elements is omitted for brevity when the elements do not differ. The drawings are schematic or conceptual views and hence, the relationship between a thickness and a width of each part, a ratio between sizes of portions, and the like, are not always equal to those of an actual device. Further, even when a portion is expressed, there may be a case where the portion may be expressed in different sizes or ratios depending on the drawings.

First Embodiment

FIG. 1 is a perspective view schematically showing a non-volatile storage device 100 according to the first embodiment. The non-volatile storage device 100 according to the embodiment is a so-called NAND-type flash memory, and includes a memory cell array 1 where memories are arranged three-dimensionally.

Figure 2:
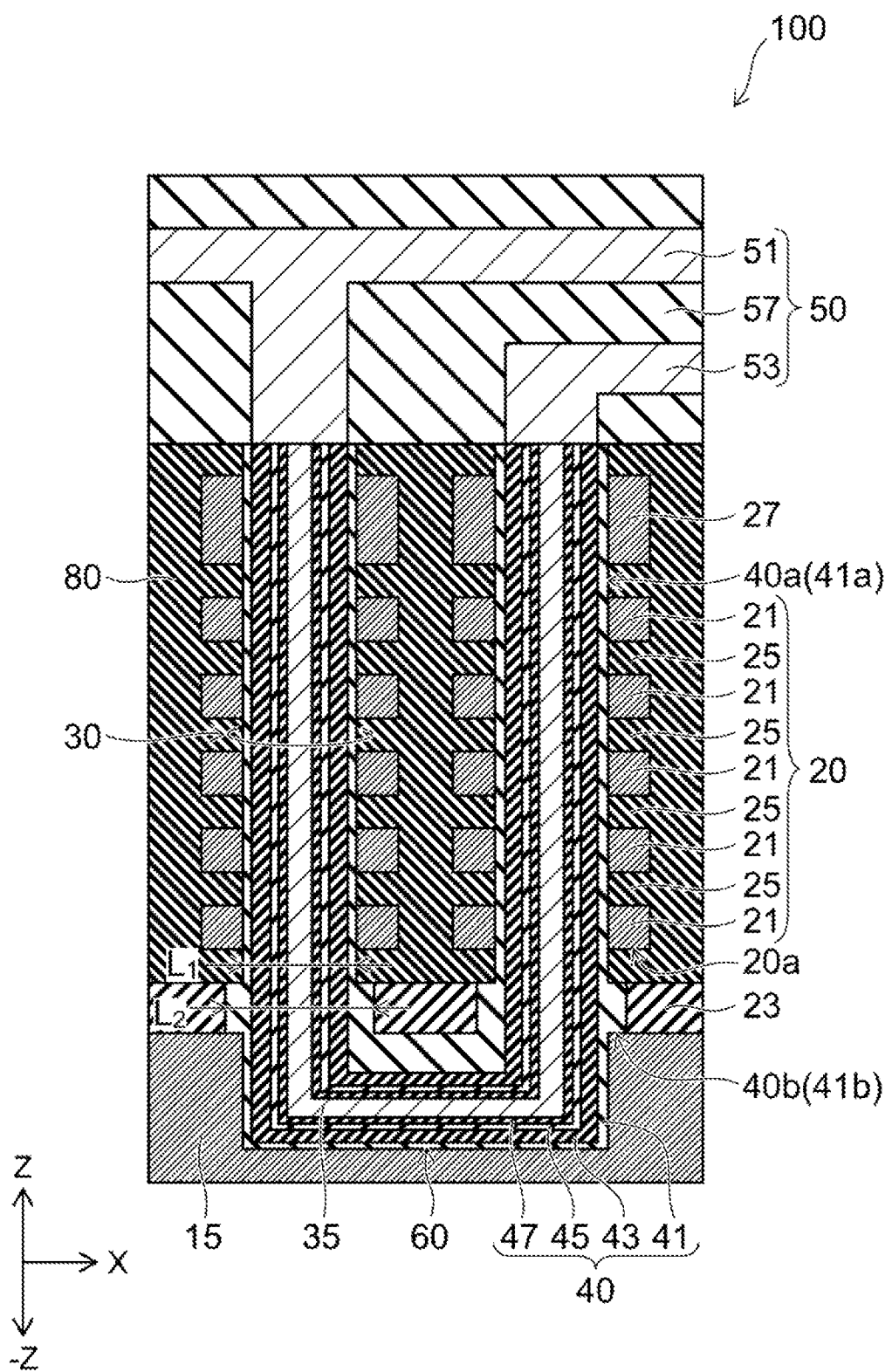
FIG. 2 is a schematic cross-sectional view showing the non-volatile storage device according to the first embodiment.

FIG. 1 is a perspective view showing a part of the memory cell array 1. To facilitate the understanding of the structure of the memory cell array 1, the insulation films are omitted from FIG. 1. That is, respective elements of the memory cell array 1 are insulated from each other by insulation films that are not shown in FIG. 1 but are shown in FIG. 2.

As shown in FIG. 1, the non-volatile storage device includes the memory cell array 1 which is mounted on a base layer 10.

The base layer 10 includes a substrate 11 and an interlayer insulation film 13 formed on the substrate 11, for example. The substrate 11 is a silicon wafer, for example, and a circuit which controls the memory cell array 1 is mounted on an upper surface 11a of the substrate 11. An interlayer insulation film 13 is formed on the substrate 11 and the memory cell array 1 is mounted on the interlayer insulation film 13.

The memory cell array 1 includes: a first layer (hereinafter referred to as a back gate layer 15) formed on the interlayer insulation film 13; stacked bodies 20 which are mounted on the back gate layer 15; a selector gate 27 which is mounted on the stacked bodies 20; and a wiring layer 50 which is formed on the selector gate 27. The stacked body 20 includes a plurality of conductive films (hereinafter referred to as word lines 21). The wiring layer 50 includes bit lines 51 and a source line 53.

In the explanation made hereinafter, the direction perpendicular to the upper surface 11a of the substrate 11 is the Z direction, a direction orthogonal to the Z direction is the X direction, and a direction orthogonal to the Z direction and the X direction is the Y direction. The Z direction may also be expressed as the upward direction, and the direction opposite to the Z direction may be expressed as the downward direction.

As shown in FIG. 1, the memory cell array 1 includes the plurality of stacked bodies 20. The plurality of stacked bodies 20 are arranged parallel to each other in the X direction. The plurality of word lines 21 included in the stacked body 20 extend in the Y direction respectively in strips, and are stacked in a spaced relationship with one another in the Z direction.

The selector gates 27 are mounted on the stacked bodies 20 which are arranged parallel to each other in the X direction respectively, and extend in the Y direction. Semiconductor pillars 30 which penetrate the stacked bodies 20 and the selector gate 27 in the Z direction are provided.

Two semiconductor pillars 30 which respectively penetrate two stacked bodies 20 arranged adjacent to each other in the X direction are electrically connected to each other by a connection portion 60. Upper ends of two semiconductor pillars 30 are electrically connected to the bit line 51 and the source line 53 via plugs 55. That is, a memory cell string 90 provided between the bit line 51 and the source line 53 includes two semiconductor pillars 30 and the connection portion 60 which connects the semiconductor pillars 30 to each other.

A memory film 40 is formed on outer surfaces of the semiconductor pillars 30 and the connection portion 60 (see FIG. 2). The memory film 40 provided between the semiconductor pillar 30 and the word line 21 functions as a charge storage film. That is, a memory cell MC is formed between each word line 21 and the semiconductor pillar 30. A selection transistor is formed between the selector gate 27 and the semiconductor pillar 30. The memory film 40 functions as a gate insulation film for the selection transistor. The memory film 40 provided to the connection portion 60 functions as a gate insulation film for the back gate transistor.

FIG. 2 is a schematic cross-sectional view showing the non-volatile storage device 100 according to the first embodiment in detail.

As shown in FIG. 2, the non-volatile storage device 100 includes: the back gate layer 15 which constitutes the first layer; a second layer (hereinafter referred to as an etching stop layer 23) which is formed on the back gate layer 15; and the plurality of stacked bodies 20 which are mounted on the etching stop layer 23 in a state where the stacked bodies 20 are arranged parallel to each other.

The stacked body 20 includes the plurality of word lines 21 which are stacked on the etching stop layer 23, and the first insulation films (hereinafter, referred to as insulation films 25) each of which is provided between two word lines 21 arranged adjacent to each other out of the plurality of word lines 21.

For example, the word line 21 is formed of a polycrystalline silicon (polysilicon) film, and the insulation film 25 is formed of a silicon oxide film. As shown in FIG. 2, when all of the films which electrically insulate the word lines 21 and the selector gates 27 formed on the word lines 21, respectively, are made of the same material (for example, silicon oxide film), it may be said that the respective constitutional elements are insulated from each other by one insulation film 80. That is, the respective constitutional elements are electrically insulated from each other via the insulation film 80. The insulation film 80 includes the insulation films 25. On the other hand, etching stop layer 23 contains, for example, at least one of aluminum oxide and tantalum oxide.

The non-volatile storage device 100 includes the plurality of semiconductor pillars 30 which penetrate the plurality of stacked bodies 20 and the etching stop layer 23 and reach the back gate layer 15, and the connection portions 60. The connection portions 60 are mounted in the back gate layer 15, and electrically connect two semiconductor pillars 30 which respectively penetrate two neighboring stacked bodies 20 out of the plurality of stacked bodies 20.

As shown in FIG. 2, each of the plurality of semiconductor pillars 30 include a semiconductor film 35 which is formed along the extending (first) direction (−Z direction) of the semiconductor pillar 30, and a memory film 40 which covers the periphery of the semiconductor film 35. The memory film 40 includes a first portion 40a which is formed between each of the plurality of stacked bodies 20 and the semiconductor film 35, and a second portion 40b which is formed between the etching stop layer 23 and the semiconductor film 35. An outer periphery $L_2$ of the second portion 40b in a plane perpendicular to the −Z direction is larger than an outer periphery $L_1$ of the first portion 40a on an etching stop layer 23 side of the stacked body 20. That is, at least at a portion of the stacked body 20 close to the etching stop layer 23, the outer periphery $L_1$ of the first portion 40a, in a plane perpendicular to the extending (second) direction of the semiconductor film 35, is smaller than the outer periphery $L_2$ of the second portion 40b. Further, a thickness of the second portion 40b in a plane perpendicular to the −Z direction is greater than a thickness of the first portion 40a in a plane perpendicular to the −Z direction.

The memory film 40 includes a first silicon nitride film (hereinafter referred to as a silicon nitride film 41) which is brought into contact with the stacked bodies 20 and the etching stop layer 23. A thickness of a silicon nitride film 41b in a plane perpendicular to the −Z direction in the second portion is greater than a thickness of a silicon nitride film 41a in a plane perpendicular to the −Z direction in the first portion.

The memory film 40 has the structure where a first silicon oxide film (hereinafter referred to as a silicon oxide film 43), a second silicon nitride film (hereinafter referred to as a silicon nitride film 45), and a second silicon oxide film (hereinafter referred to as a silicon oxide film 47) are stacked sequentially in the direction from the silicon nitride film 41 toward the semiconductor film 35, and the silicon oxide film 47 is brought into contact with the semiconductor film 35.

The connection portion 60 includes a portion of the memory film 40 and a portion of the semiconductor film 35. That is, the memory film 40 is formed between the portion of the semiconductor film 35 and the back gate layer 15.

Next, a method of manufacturing the non-volatile storage device 100 according to the first embodiment is explained with reference to FIG. 3A to FIG. 6. FIG. 3A to FIG. 6 are schematic cross-sectional views showing steps of manufacturing the non-volatile storage device 100 according to the first embodiment.

Figure 3A:
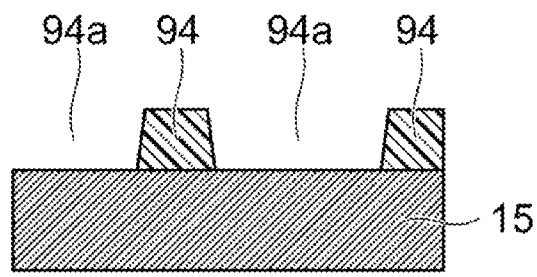
FIG. 3A to FIG. 3D are schematic cross-sectional views showing steps of manufacturing the non-volatile storage device according to the first embodiment.

As shown in FIG. 3A, a resist 94 is formed on the back gate layer 15. The back gate layer 15 is formed of a polysilicon layer doped with a dopant such as boron, for example. The resist 94 is provided with openings 94a which are selectively formed by patterning.

Figure 3B:
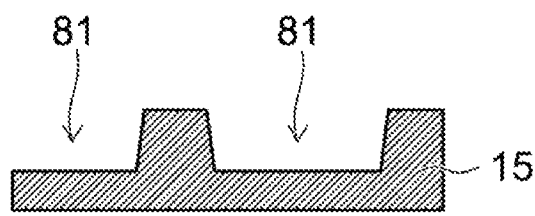

Next, the back gate layer 15 is selectively etched by dry etching using the resist 94 as a mask thus forming recessed portions 81 in an upper portion of the back gate layer 15 as shown in FIG. 3B.

Figure 3C:
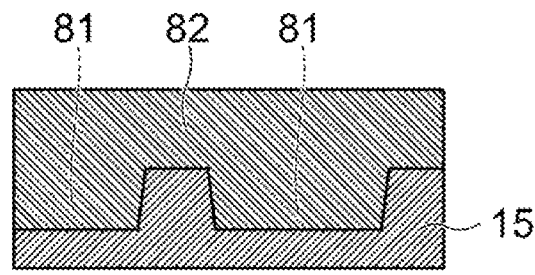
Figure 3D:
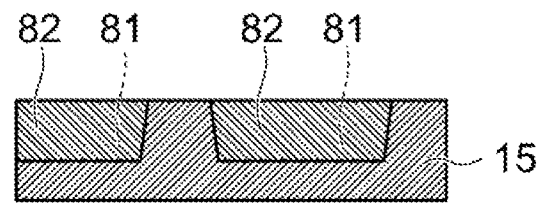

Then, as shown in FIG. 3C, a sacrificial film 82 is embedded into the recessed portions 81. The sacrificial film 82 is formed of a silicon nitride film, a non-doped polysilicon film or the like, for example. Subsequently, the whole surface of the sacrificial film 82 is etched back and, as shown in FIG. 3D, the back gate layer 15 between the recessed portions 81 is exposed.

Next, as shown in FIG. 4A, the etching stop layer 23 is formed on the back gate layer 15, and a plurality of conductive films 121 and a plurality of insulation films 25 are alternately stacked on each other. As shown in FIG. 4A, the insulation film 25 is interposed between two conductive films 121 arranged adjacent to each other in the Z direction. The insulation film 25 is formed on the uppermost conductive film 121.

Next, as shown in FIG. 4B, the plurality of conductive films 121 and the insulation films 25 are divided by photolithography and etching techniques thus forming grooves 61a which reach the etching stop layer 23. Due to such processing, the conductive film 121 is divided into a plurality of word lines 21 and hence, individual stacked bodies 20 are formed.

The etching stop layer 23 is formed of a material which is not etched under the etching conditions for etching of the conductive films 121 and the insulation films 25, or is a material whose etching rate is lower than etching rates of the conductive films 121 and the insulation films 25 when exposed to the selected etchant. Accordingly, it is possible to prevent the grooves 61a from reaching the back gate layer 15 thus facilitating formation of the grooves 61a.

Next, an insulation film 61 is formed and is embedded into the grooves 61a. Subsequently, as shown in FIG. 4B, the insulation films 61 are etched back and hence, the insulation film 25 is exposed and portions of the insulation films 61 embedded in the grooves 61a are left in place. Subsequently, as shown in FIG. 4C, an insulation film 63 is formed on the insulation film 25. Then, a conductive film 127, which becomes the selector gates 27, and an insulation film 65 are formed on the insulation film 63.

Figure 5A:
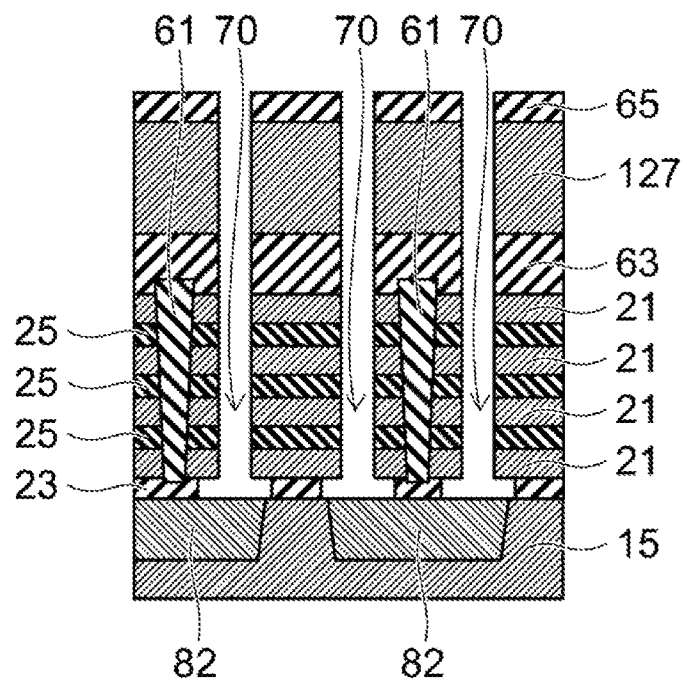
FIG. 5A and FIG. 5B are schematic cross-sectional views showing steps of manufacturing the non-volatile storage device which follow the steps shown in FIG. 4A to FIG. 4C.

Then, as shown in FIG. 5A, memory holes 70, which penetrate the conductive film 127, the stacked bodies 20 and the etching stop layer 23 and reach the back gate layer 15, are formed. Lower ends of the memory holes 70 reach the sacrificial film 82, and the sacrificial film 82 is exposed to bottom portions of the memory holes 70.

It is possible to form the memory hole 70 by etching the conductive layer 127, the stacked bodies 20 and the etching stop layer 23 using a Reactive Ion Etching (RIE) method after forming an etching mask (not shown in the drawing) on the insulation film 65, for example.

Then, the etch stop layer is selectively etched such that a width of an inner wall of a portion of the memory hole 70, which penetrates the etching stop layer 23, is expanded.

For example, assuming that the etch stop layer 23 is made of aluminum oxide ($Al_2O_3$), the insulation films 25, 63, 65 are formed of a silicon oxide film, and the word lines 21 and the conductive film 127 are formed of a polysilicon film, it is possible to selectively etch the etching stop layer 23 using NC2. That is, in the NC2 treatment, an etching rate of aluminum oxide is higher than an etching rate of a silicon oxide film and p-type polysilicon. Here, NC2 is a solution obtained by mixing choline (2-hydroxy ethyl tri-methyl ammonium hydroxide), hydrogen peroxide and water.

Before the etch stop layer 23 is selectively etched, respective end portions of the plurality of word lines 21 and the conductive film 127, which are exposed to the inner wall of the memory hole 70, are converted into silicon oxide by oxidation. Due to such treatment, it is possible to increase a selection ratio in etching between the etch stop layer 23, and the stacked bodies 20 and the conductive film 127.

It is also possible to selectively etch the etch stop layer 23 by oxidizing end portions of the polysilicon films which are exposed to the inner walls of the memory holes 70 and, thereafter, by performing treatment using an etchant containing potassium hydroxide (KOH).

Next, the sacrificial films 82 embedded in the back gate layer 15 are selectively etched through the memory holes 70. For example, when the sacrificial films 82 are formed of a non-doped polysilicon film, it is possible to etch the sacrificial films 82 by wet etching using alkali-based chemicals such as a KOH (potassium hydroxide) solution. Alternatively, when the sacrificial film 82 is formed of a silicon nitride film, it is possible to etch the sacrificial film 82 by wet etching using a phosphoric acid ($H_3PO_4$) solution. In this case, it is possible to adjust an etching rate of the sacrificial film corresponding to a temperature condition.

Figure 5B:
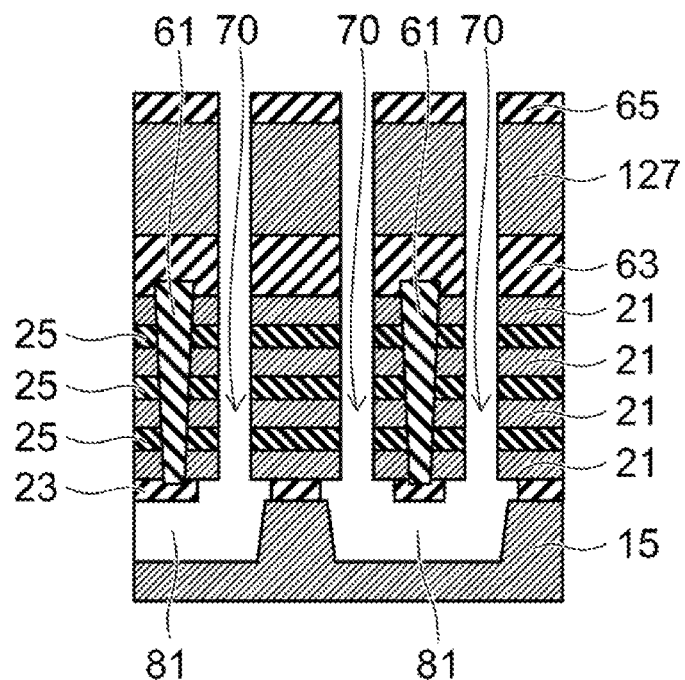

Due to such processing, as shown in FIG. 5B, the sacrificial films 82 are selectively removed and hence, the recessed portions 81 are reproduced in the back gate layer 15. It is possible to provide the structure where two memory holes 70 are connected with each other through one recessed portion 81.

Figure 6:
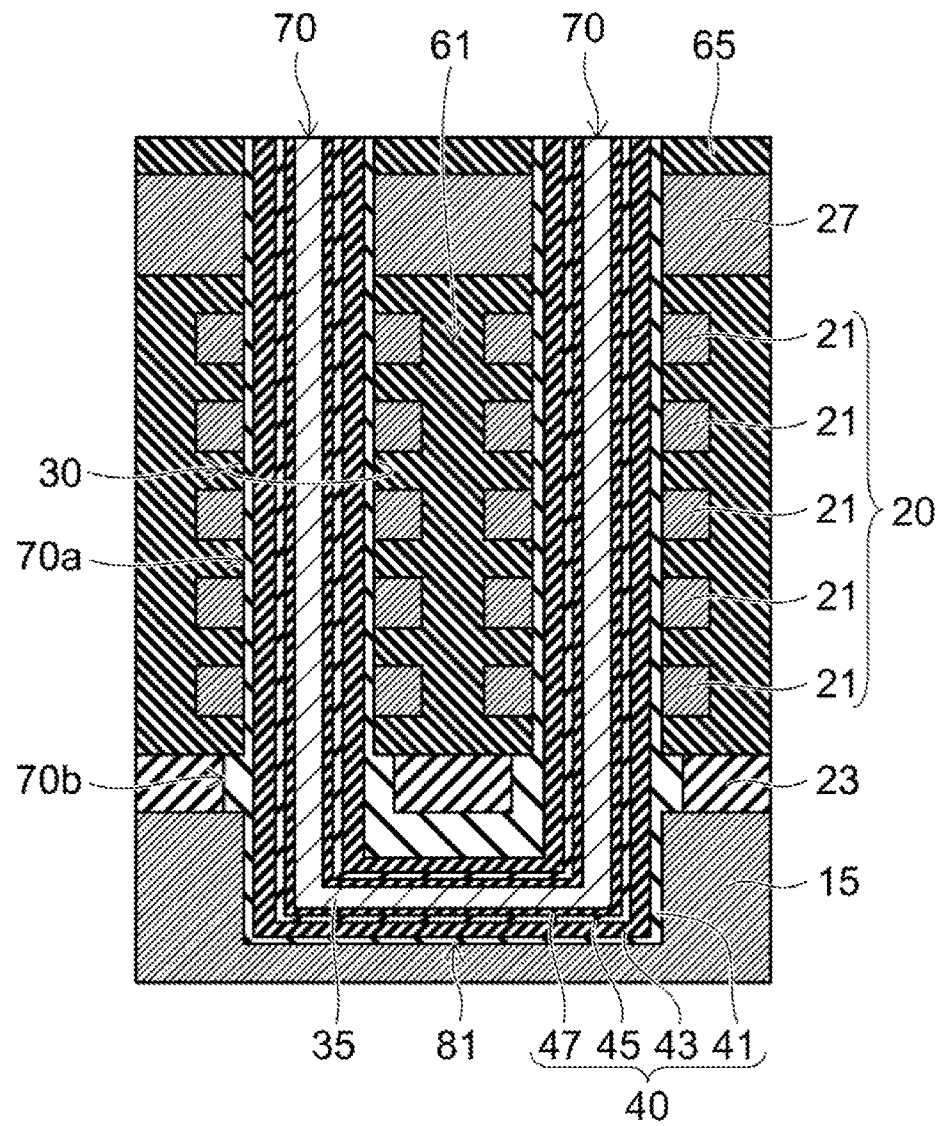
FIG. 6 is a schematic cross-sectional view showing a step of manufacturing the non-volatile storage device which follows the steps shown in FIG. 5A and FIG. 5B.

Next, as shown in FIG. 6, the memory film 40 is formed on inner walls of the memory holes 70 and an inner surface of the recessed portion 81, and the semiconductor film 35 is formed on the memory film 40.

For example, the memory film 40 includes: a silicon nitride film 41 formed on the inner walls of the memory holes 70 and an inner surface of the recessed portion 81; a silicon oxide film 43 formed on the silicon nitride film 41; a silicon nitride film 45 formed on the silicon oxide film 43; and a silicon oxide film 47 formed on the silicon nitride film 45.

The semiconductor film 35 is formed of a polysilicon film which is formed on the silicon oxide film 47, for example. The inner spaces of the memory holes 70 and the inner space of the recessed portion 81 may be completely filled with the semiconductor film 35, or the semiconductor film 35 may have the hollow structure where a gap is made to remain at the center thereof.

Subsequently, the conductive film 127 is divided into the plurality of selector gates 27, and the wiring layer 50 is formed on the selector gate 27 (see FIGS. 1 and 2). Due to such a constitution, the memory cell array 1 can be completed on the base layer 10.

Figure 7:
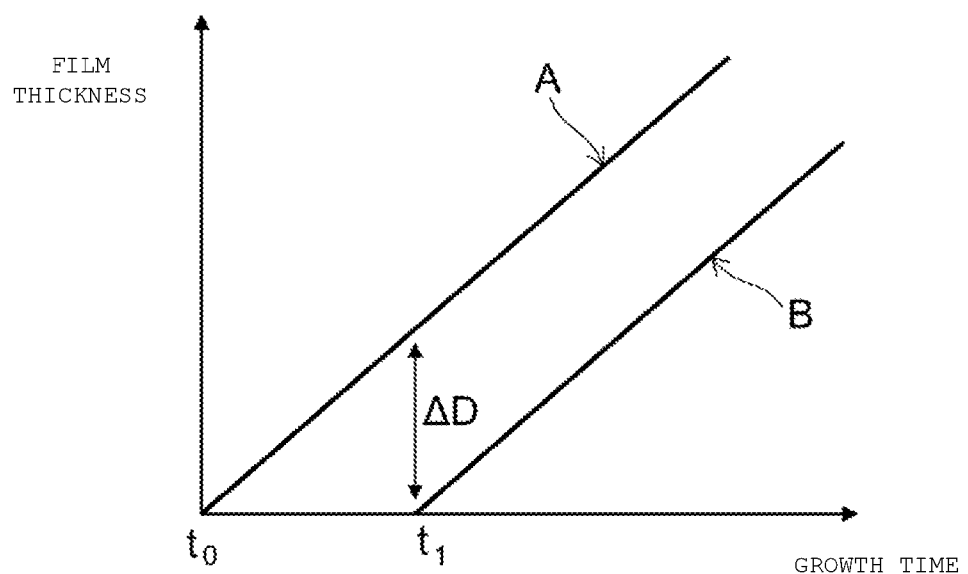
FIG. 7 is a graph schematically showing film forming characteristics in the steps of manufacturing the non-volatile storage device according to the first embodiment.

FIG. 7 is a graph schematically showing film forming characteristics in the steps of manufacturing the non-volatile storage device according to the first embodiment. A film forming time is shown on the abscissa, and a film thickness is shown on the ordinate. In FIG. 7, a line A indicates the film forming characteristic of a silicon nitride film formed on aluminum oxide, for example, and a line B indicates the film forming characteristic of a silicon nitride film formed on the silicon oxide film.

In the example shown in the line A, a silicon nitride film is formed at a fixed speed (rate) from a point of time $t_0$. In contrast, in the example shown by the line B, a silicon nitride film is not formed from the point of time $t_0$ but instead is formed at a fixed speed from a point of time $t_1$. This result expresses the so-called incubation time. For example, this result expresses that the growth of a silicon nitride film starts after a surface of the silicon oxide film is formed into nitride during the period from the point of time $t_0$ to the point of time $t_1$.

The point of time $t_0$ shown in FIG. 7 indicates the point of time at which the formation of the silicon nitride film on aluminum oxide starts. That is, although the incubation time also exists in forming the silicon nitride film on aluminum oxide, the incubation time is shorter than the incubation time when the silicon nitride film is formed on the silicon oxide film.

As a result, when a silicon nitride film is formed on a surface where a silicon oxide film and aluminum oxide exist in a mixed state, a thickness of the silicon nitride film formed on aluminum oxide becomes greater than a thickness of the silicon nitride film formed on a silicon oxide film by an amount indicated as ΔD.

Also when a silicon nitride film is formed on polysilicon, an incubation time appears in the same manner and hence, a film thickness of the silicon nitride film becomes less than a film thickness of a silicon nitride film formed on aluminum oxide. That is, in many cases, a thin silicon oxide film is formed on a surface of polysilicon and hence, an incubation time substantially equal to an incubation time of a silicon nitride film formed on a silicon oxide film results.

Figure 8:
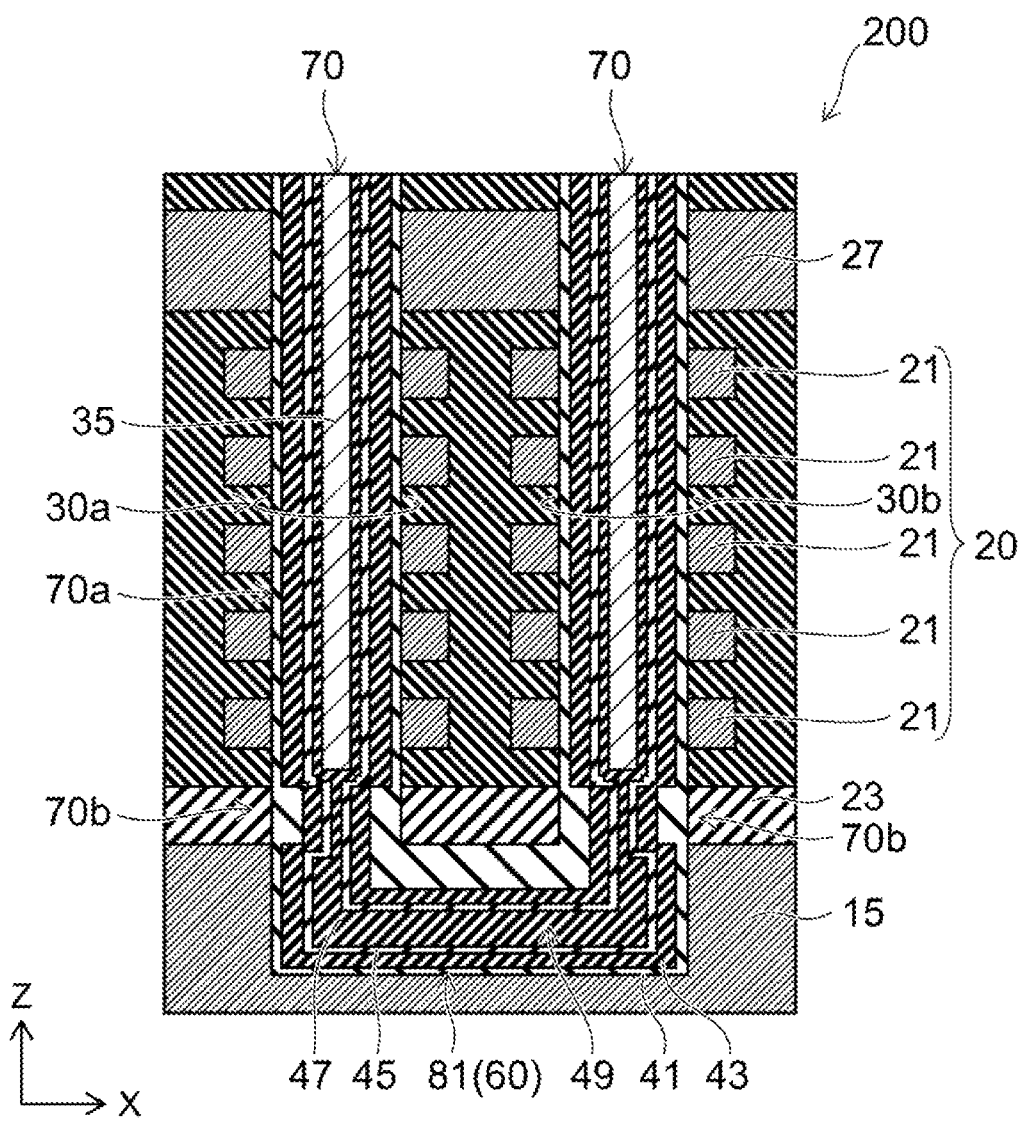
FIG. 8 is a schematic cross-sectional view showing a non-volatile storage device according to a comparison example.

FIG. 8 is a schematic cross-sectional view showing a non-volatile storage device 200 according to a comparison example. Also in the comparison example, an etching stop layer 23 is formed on a back gate layer 15, and stacked bodies 20 and selector gates 27 are formed on the etching stop layer 23. Further, memory holes 70 which penetrate the selector gates 27, the stacked bodies 20 and the etching stop layer 23 are formed, and a recessed portion 81 is formed in the inside of the back gate layer 15.

In this example, a portion 70b of the memory hole 70 which penetrates the etching stop layer 23 is not expanded, and a width of the portion 70b in the X direction is equal to a width of a portion 70a of the memory hole 70 which penetrates the stacked body 20 in the X direction.

According to the film forming characteristics shown in FIG. 7, the silicon nitride film 41 which is formed on the inner wall of the portion 70b of the memory hole 70, which penetrates the etching stop layer 23, is formed to have a thickness greater than a thickness of the silicon nitride film 41 formed on inner walls of other portions of the memory hole 70. Accordingly, after the silicon nitride film 41 is formed, a width of an inner space of the portion 70b of the memory hole 70 which penetrates the etching stop layer 23 becomes less than a width of an inner space of other portions of the memory hole 70. In this comparison example, in steps of sequentially forming the silicon oxide film 43, the silicon nitride film 45 and the silicon oxide film 47, the memory hole 70 is closed at the portion 70b which penetrates the etching stop layer 23 and hence, the semiconductor film 35 is not formed in the recessed portion 81. That is, a portion which electrically connects two semiconductor pillars 30a, 30b to each other is not formed in a connection portion 60 and hence, as a result, a memory cell string 90 (see FIG. 1) is not operational.

To the contrary, in the embodiment, the portion 70b of the memory hole 70 which penetrates the etching stop layer 23 is expanded (see FIG. 6). Accordingly, as shown in FIG. 6, even when the silicon nitride film having a large thickness is formed on the etching stop layer 23, it is possible to avoid a width of an inner space of the portion 70b, which penetrates the etching stop layer, from becoming smaller than widths of inner spaces of other portions of the memory hole 70. As a result, it is possible to avoid the closing of the memory hole 70 thus enhancing a yield of manufacturing the non-volatile storage device 100.

Figure 9A:
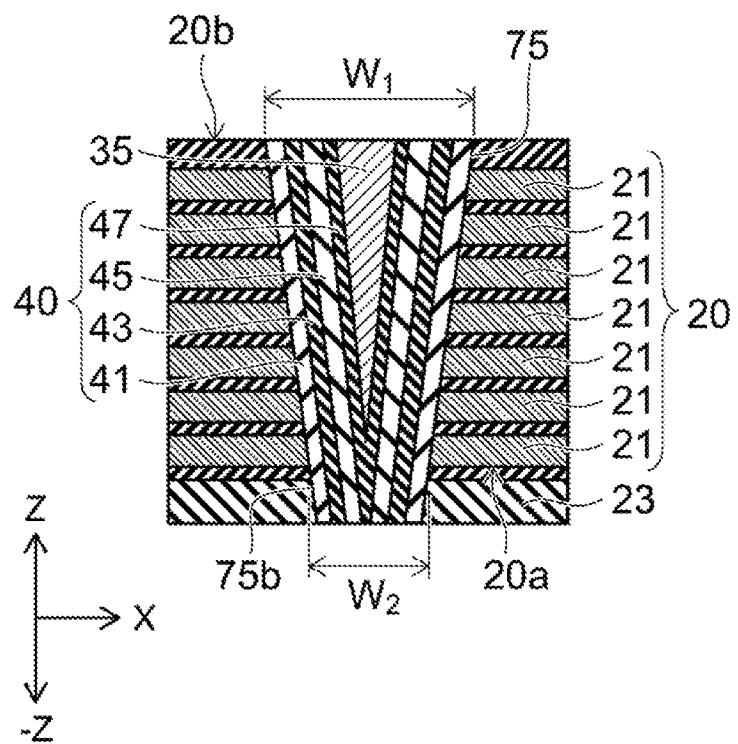
FIG. 9A is a schematic cross-sectional view showing a non-volatile storage device according to another comparison example.

FIG. 9A is a schematic cross-sectional view showing a non-volatile storage device according to another comparison example. For example, it is difficult to form a memory hole to have a fixed width in the X direction as in the case of the memory hole 70 shown in FIG. 2. In many cases, as in the case of a memory hole 75 shown in FIG. 9A, a width $W_2$ of the memory hole 75 at a lower surface 20a of a stacked body 20 becomes smaller than a width $W_1$ of the memory hole 75 at an upper surface 20b of the stacked body 20. Accordingly, in the memory hole 75, a memory film 40 is formed such that an outer periphery of the memory film 40 at the lower surface 20a of the stacked body 20, which faces an etching stop layer 23 in an opposed manner, is smaller than an outer periphery of the memory film 40 at the upper surface 20b of the stacked body 20. Due to such a constitution, on a portion 75b of the memory hole 75, which penetrates the etching stop layer 23 below the stacked body 20, closing of the memory hole 75, and thus an inability to form the semiconductor film 35 all the way through the opening, is likely to occur.

Figure 9B:
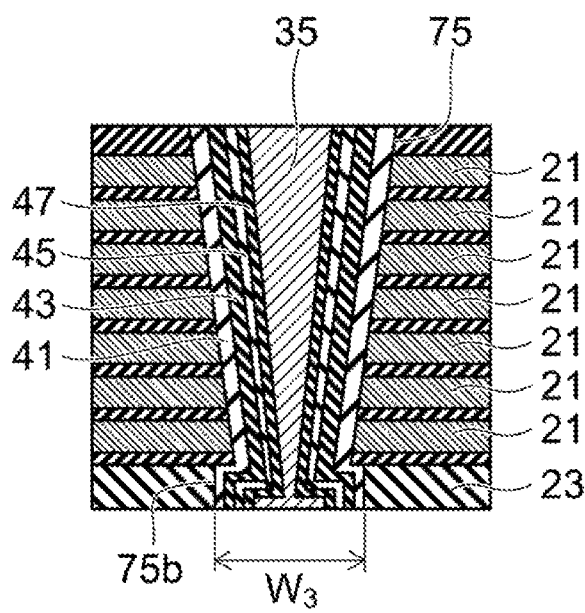
FIG. 9B is a schematic cross-sectional view showing a non-volatile storage device according to another embodiment

FIG. 9B is a schematic cross-sectional view showing a non-volatile storage device according to another embodiment. Accordingly, as shown in FIG. 9B, it is also desirable that the memory hole 75 is formed such that the portion 75b which penetrates the etching stop layer 23 is expanded. Due to such a constitution, it is possible to avoid the closing of the memory hole 75 and hence, a semiconductor film 35 can be formed on the whole memory cell string 90 continuously. As a result, the electrical connection of the memory cell string 90 can be ensured and hence, a yield of manufacturing non-volatile storage devices may be enhanced.

As has been explained heretofore, in this embodiment, an outer periphery of the memory hole 70 is expanded by selectively etching the etching stop layer 23. Due to such processing, it is possible to avoid closing of the memory hole 70 at the time of forming the memory film 40 which occurs because of the longer growth period on the etch stop layer, thus reducing an open defect of the memory cell string 90.

If closing of the memory hole 70 may be avoided, it is possible to form the silicon nitride film 41 with a large thickness, for example. Due to such a constitution, an injection of a charge from the word lines 21 may be suppressed and hence, memory holding characteristic of the memory cell and the reliability of the memory cell can be enhanced.

Second Embodiment

Figure 10:
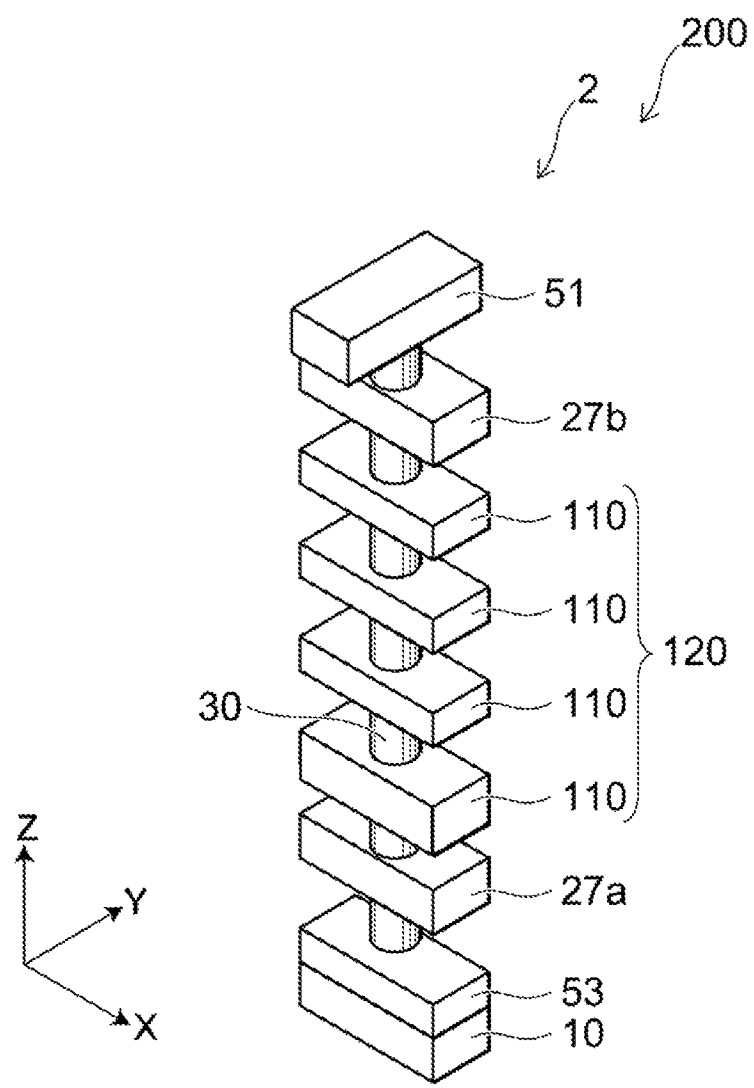
FIG. 10 is a perspective view schematically showing a non-volatile storage device according to a second embodiment.

FIG. 10 is a perspective view schematically showing a non-volatile storage device 200 according to a second embodiment. The non-volatile storage device includes a memory cell array 2 mounted on a base layer 10.

As shown in FIG. 10, the memory cell array 2 includes: a first layer (hereinafter referred to as a source line 53) formed on the base layer 10; a selector gate 27a which is formed on the source line 53; a stacked body 120 which is formed on the selector gate 27a; another selector gate 27b which is formed on the stacked body 120; and a bit line 51 which is formed on the selector gate 27b. The memory cell array 2 also includes a semiconductor pillar 30 which penetrates the selector gate 27a, the stacked body 120 and the selector gate 27b in the Z direction. Both ends of the semiconductor pillar 30 are electrically connected to the source line 53 and the bit line 51 respectively. The stacked body 120 includes a plurality of conductive films (hereinafter referred to as word lines 110) stacked to each other in the Z direction.

Figure 11:
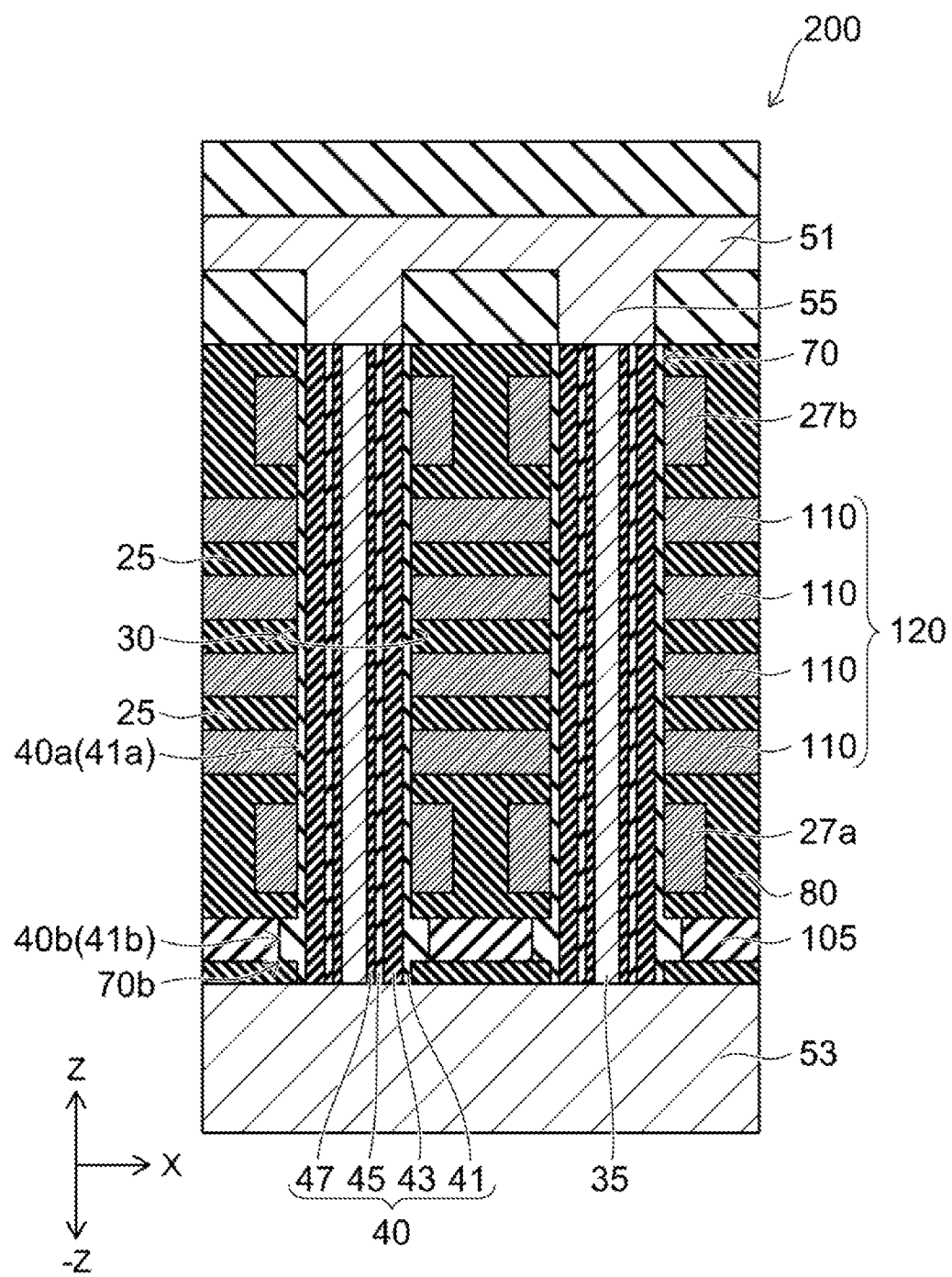
FIG. 11 is a schematic cross-sectional view showing the non-volatile storage device according to the second embodiment.

FIG. 11 is a schematic cross-sectional view showing the non-volatile storage device 200 according to the second embodiment in detail. The non-volatile storage device 200 includes: a source line 53 which constitutes a first layer; a second layer (hereinafter referred to as a memory hole expansion layer 105) which is formed on the source line 53; selector gates 27a which are formed on the memory hole expansion layer 105; stacked bodies 120 which are formed on the selector gates 27a; and selector gates 27b which are mounted on the stacked bodies 120. The non-volatile storage device 200 further includes semiconductor pillars 30 each of which penetrate the selector gate 27b, the stacked body 120, the selector gate 27a and the memory hole expansion layer 105, and reaches the source line 53.

The stacked body 120 includes a plurality of word lines 110, and insulation films 25 each of which is formed between two word lines 110 arranged adjacent to each other out of the plurality of word lines 110. The semiconductor pillar 30 includes: a semiconductor film 35 which is arranged along the extending direction (−Z direction) of the semiconductor pillar 30; and a memory film 40 which covers the periphery of the semiconductor film 35.

The memory film 40 includes: a first portion 40a which is formed between the stacked body 120 and the semiconductor film 35; and a second portion 40b which is formed between the memory hole expansion layer 105 and the semiconductor film 35. The outer periphery of the second portion 40b, in a plane perpendicular to the −Z direction, is greater than the outer periphery of the first portion 40a, in a plane of the stacked body, which opposes the memory hole expansion layer 105.

Also in this embodiment, by expanding the outer periphery of the portion 70b of the memory hole 70, which penetrates the memory hole expansion layer 105, it is possible to avoid the closing of the memory hole 70 thus ensuring electrical conduction of a memory cell string between the source line 53 and the bit line 51.

The memory hole expansion layer 105 contains at least either one of aluminum oxide and tantalum oxide, for example, and enables etching selectivity with the word line 110, the selector gate 27 and the insulation film 25.

In this manner, the second layer is not limited to the etching stop layer, any layer may be adopted provided that the layer has selectivity in etching with other elements which constitute a memory cell array and can expand an inner wall of a portion of the memory hole 70 which penetrates the second layer. Further, by arranging the second layer below the stacked body 20 and the stacked body 120, it is possible to avoid the closing of the memory hole 70 thus enhancing a yield of manufacturing and the reliability of the memory cells MC.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a non-volatile storage device, the method comprising:
    preparing a substrate having a first layer of a conductive material; a second layer above the first layer; and a stacked body including a plurality of conductive films and a plurality of insulative films stacked above the second layer;
    etching a groove through the stacked body to the second layer in a first etch process, the second layer being an etch stop material in the first etch process;
    filling the groove with an insulating material;
    forming an insulating layer above the groove and the stacked body;
    forming a conductive layer over the insulating layer;
    forming a memory hole which penetrates through the conductive layer, the insulating layer, the stacked body, and the second layer and reaches the first layer in a second etch process; and
    after forming the memory hole, selectively etching the second layer in a third etch process so that a width of the memory hole at the second layer is expanded; and
    forming a memory film on an inner wall of the memory hole, the memory film contacting the plurality of conductive films and insulative films of the stacked body.

2. The method of claim 1, wherein the second layer comprises aluminum oxide.

3. The method of claim 1, wherein the second layer comprises tantalum oxide.

4. The method of claim 1, wherein the insulative films of the stacked body each comprise a silicon oxide film and the plurality of the conductive films of the stacked body each comprise a polycrystalline silicon film.

5. The method of claim 1, wherein the second etch process is a reactive ion etch process.

6. The method of claim 1, wherein a solution of 2-hydroxy ethyl tri-methyl ammonium hydroxide, hydrogen peroxide and water is used for selectively etching the second layer in the third etch process.

7. The method of claim 1, wherein the memory film comprises silicon nitride.

8. The method of claim 4, wherein the second layer is one of aluminum oxide or tantalum oxide.

9. A method of manufacturing a non-volatile storage device comprising:
    preparing a substrate which includes: a first layer of a conductive material; a second layer of a first insulative material above the first layer; and a stacked body including a plurality of conductive films and insulating films stacked in an alternating manner above the second layer, the insulating films being a second insulative material different from the first insulative material;

forming a memory hole which penetrates through the stacked body and the second layer and reaches the first layer;

after forming the memory hole, selectively etching the second layer in an etch process that does not substantially etch the insulating films of the stacked body to expand a width of the memory hole at the second layer; and forming a silicon nitride film on an inner wall of the second layer after expanding the width of the memory hole at the second layer.

10. The method of claim 9, wherein the second layer comprises aluminum oxide.

11. The method of claim 9, wherein the second layer comprises tantalum oxide.

12. The method of claim 9, wherein conductive films of the stacked body are polycrystalline films and the insulative films of the stacked body are silicon oxide films.

13. The method of claim 9, wherein the memory hole is formed in an reactive ion etch process that etches both the stacked body and the second layer.

14. The method of claim 9, wherein in the etch process for selectively etching the second layer a solution of 2-hydroxy ethyl tri-methyl ammonium hydroxide, hydrogen peroxide and water is used as an etchant.

15. A method of manufacturing a non-volatile storage device comprising:

preparing a wafer which includes: a source line layer, an insulation layer above the source line layer, a memory hole expansion preparation layer above the insulation layer, and a stacked body including a plurality of conductive films and insulative films stacked above the memory hole expansion preparation layer;

etching a hole through the stacked body, the memory hole expansion preparation layer, and the insulation layer to reach the source line layer;

after etching the hole, forming a memory hole expansion layer by selectively etching the memory hole expansion preparation layer such that the hole is wider at the memory hole expansion layer than at the insulation layer or in the stacked body; and forming a silicon nitride film on an inner wall of the memory hole expansion layer, wherein the memory hole expansion preparation layer is a first material, and the insulative films are a second material different from the first material.

16. The method of claim 15, wherein the memory hole expansion preparation layer comprises aluminum oxide.

17. The method of claim 15, wherein the memory hole expansion preparation layer comprises tantalum oxide.

18. The method of claim 15, wherein the insulative films of the stacked body are silicon oxide films and the conductive films of the stacked body are polycrystalline silicon films.

19. The method of claim 15, wherein reactive ion etching is used in the forming the hole.

20. The method of claim 15, wherein a solution of 2-hydroxy ethyl tri-methyl ammonium hydroxide, hydrogen peroxide and water is used for selectively etching the memory hole expansion preparation layer to expand the width of the hole.

* * * * *